United States Patent [19]
Schieber et al.

[11] Patent Number: 5,892,227
[45] Date of Patent: Apr. 6, 1999

[54] RADIATION DETECTION SYSTEM AND PROCESSES FOR PREPARING THE SAME

[75] Inventors: Michael Misho Schieber; Jacob Baruch Nissenbaum, both of Jerusalem; Ze'ev Harel, Hofit, all of Israel

[73] Assignees: Yissum Research Development Company of the Hebrew University of Jerusalem, Jerusalem; Target Technologies Israel, Ltd., Chofit, both of Israel

[21] Appl. No.: 809,366

[22] PCT Filed: Sep. 29, 1995

[86] PCT No.: PCT/US95/12222

§ 371 Date: Jun. 17, 1997

§ 102(e) Date: Jun. 17, 1997

[87] PCT Pub. No.: WO96/10194

PCT Pub. Date: Apr. 4, 1996

[30] Foreign Application Priority Data

Sep. 29, 1994 [IL] Israel ......................................... 111085
Apr. 28, 1995 [IL] Israel ......................................... 113535

[51] Int. Cl.$^6$ ................................................. H01L 21/477
[52] U.S. Cl. ................................. 250/370.12; 250/370.13
[58] Field of Search ........................... 250/370.13, 370.12

[56] References Cited

U.S. PATENT DOCUMENTS 3,754,965 8/1973 Mooney .
3,812,361 5/1974 Prag et al. .
4,048,502 9/1977 Guddent et al. .
4,243,885 1/1981 Agouridis et al. .................. 250/370.07
4,331,873 5/1982 Miller et al. .
4,894,542 1/1990 Schneider .............................. 250/336.2
5,047,645 9/1991 Gundjian et al. .
5,072,122 12/1991 Jiang et al. .
5,079,426 1/1992 Antonuk et al. .
5,245,191 9/1993 Barber et al. .

OTHER PUBLICATIONS

James et al., "Defects in Silver–Doped Merwric Iodide Crystals . . . " in R.B. James et al., ed. Semiconductors For Room–Temperature Radiation Detector Applications, *Materials Research Society Symposium Proceedings*, vol. 302, pp. 103–114 (Apr. 1993).

Gerrish, "Electronic Characterization of Mercuric Iodide Gamma Ray Spectrometers" in R.B. James et al. ed., Semiconductors For Room–Temperature Radiation Detector Applications, *Materials Research Society Symposium Proceedings*, vol. 302, pp. 129–140 (Apr. 1993).

Schieber et al. "Physical–Chemical Consideration for Semiconductor Room–Temperature Radiation Detectors" in R.B. James et al. ed., Semiconductors For Room–Temperature Radiation Detector Applications, *Materials Research Society Symposium Proceedings*, vol. 302, pp. 347–355 (Apr. 1993).

*Primary Examiner*—Constantine Hannaher
*Attorney, Agent, or Firm*—Foley & Lardner

[57] ABSTRACT

A radiation detection system having a continuous film of a wide band gap semiconductor, radiation-detecting, polycrystalline material formed from a multiplicity of crystalline grains, wherein the grains are sintered together to form a single, coherent, continuous film.

27 Claims, 6 Drawing Sheets

CROSS GRID ARRAY

CROSS GRID ARRAY

RADIATION DETECTION SYSTEM AND PROCESSES FOR PREPARING THE SAME

The present invention relates to a radiation detection system containing a continuous film of a wide band gap semiconductor, radiation-detecting, polycrystalline material and processes for the preparation of said continuous film for use therein, as well as to an image receptor for an imaging system, comprising a thin, continuous film of a wide band gap, semiconductor radiation-detecting material.

Mercuric iodide ($HgI_2$), cadmium telluride (CdTe), cadmium zinc telluride (CdZnTe), and lead iodide ($PbI_2$) single crystals are well-known, wide band gap semiconductor X-ray and gamma radiation detectors which operate at room temperature. The problem is that the production of high quality, single crystals is very expensive; wherever it is necessary to cover large areas with relatively small area crystals, it is necessary to arrange them in the form of mosaics, which in turn increases the cost of the detection system. The cost of crystal growth of both high melting point crystals, such as CdTe and CdZnTe (see Table 1 hereinbelow), and of low melting point crystals such as $PbI_2$ is high. Therefore, only crystals of a very small size ($\approx 10$ $mm^2$) and thickness ($\approx 100$ $\mu m$) have been produced, which decreases the possibility of using them in mosaics for very large-area detection systems.

The state of the art of $PbI_2$ single crystal technology in 1995 is such that until the present time, these very small crystals have been fabricated only into low energy detectors.

The semiconductor having the lowest melting point, $HgI_2$, has an additional problem: $HgI_2$ single crystals are produced from the vapor phase, and growth of large crystals, from which 5×5 $cm^2$ detector plates can be sliced, may require a duration of approximately 3 months for the growth process. In addition, the sawing and polishing operation involves a 60% loss of material.

All of the above-mentioned factors contribute to the high cost of these crystals and the detectors fabricated therefrom.

The present invention provides for the production of large, textured plates of any desired size and thickness, produced from different polycrystalline semiconductors, as will be described and exemplified further below.

The present invention also enables the fabrication of polycrystalline, continuous films for radiation detection systems. The term "continuous films" as used herein is intended to denote that no short circuits between upper and lower electrodes are possible.

More particularly, the present invention provides a radiation detection system, comprising a continuous film of a wide band gap semiconductor, radiation-detecting, polycrystalline material formed from a multiplicity of crystalline grains, wherein said grains are sintered together to form a single, coherent, continuous film.

In preferred embodiments of the present invention, said continuous film is selected from the group consisting of mercuric iodide, cadmium telluride, cadmium zinc telluride, and lead iodide films.

Thus, according to the present invention, there are provided large-area, coherent, continuous semiconductor films, preferably having an area of between $10^2$ $cm^2$ and $10^4$ $cm^2$, and a thickness of between about 1–500 $\mu m$, which can be partially or fully textured (50–100%), with grain size from 1 $\mu m$ to 5 mm.

The present invention also provides processes for the preparation of these films. More specifically, the present invention provides a process for the preparation of a continuous film of a wide gap semiconductor, radiation-detecting, polycrystalline material, comprising (a) preparing grains of polycrystalline powder material having a purity of at least 99.9999 (6N) %; (b) depositing said granular material on a conductive substrate; and (c) sintering said grains of polycrystalline material together, to form a single, coherent, continuous film.

In preferred embodiments of said process, said purified grains of polycrystalline powder material are prepared by evaporation in a vacuum medium at a temperature of about 100°–300° C., by sequential repeated evaporation.

In a first embodiment of the process of the present invention, an upper plate of a conductive metal is placed on top of said powder, and the resulting assembly is compressed at a temperature of about 100°–220° C., and at a pressure of about 100–5,000 $kg/cm^2$.

In a second embodiment of the process of the present invention, said granular material from step (a) is mixed with an organic binder in a solvent, and the n deposited on said substrate, followed by annealing at a temperature of about 60°–120° C. While this deposition embodiment may be carried out by painting, spraying, or printing on the substrate, in especially preferred embodiments it is carried out by mask printing.

In yet a third preferred embodiment of the process of the present invention, said purified, granular material from step (a) is placed in a heated area of a vacuum chamber at a temperature of about 90°–220° C., and said conductive substrate is placed in an $LN_2$ cooled area of said vacuum chamber, whereby said purified granular material is sublimed and deposited on said substrate, and said melding is carried out by heating and annealing at a temperature of about 50°–100° C. in the presence of $N_2$.

The films produced by the processes of the present invention can be used in various radiation detection systems, such as in energy-dispersive x-ray and gamma ray imaging systems based on semiconductor film detectors.

While the above-defined processes will be specifically exemplified hereinafter, it is believed that a brief, general description of preferred embodiments of the various steps of variations of the presently-claimed process (which variations will be referred to hereinafter as "hot pressing," "slurry deposition," and "vapor phase deposition") will better serve to elucidate the invention.

1. Hot Pressing

The process is composed of the following steps:
a) Purification of the starting materials by sublimation four times at 100°–200° C., in a glass ampoule and under continuous pumping by a vacuum pump; melting for from 1 hour to 3 days at 250°–300° C., and closed ampoule sublimation.
b) Choosing a substrate, which is introduced into the bottom section of the mold. The substrate may be glass, polycrystalline Alumina, or TEFLON (a polytetrafluoroethylene resin) and must be precontacted with metal electrodes, preferably in the form of photolithographic deposition of fine strips. Alternatively, the substrate plate could serve as a bottom electrode if it is a metal such as gold, palladium, silicon or germanium.
c) The purified powder is introduced on top of the substrate of step (b).
d) An upper plate of palladium or gold is placed on top of the powder, in order to prevent reaction with the upper pressing punch of the steel mold.
e) The assembly is compressed, the temperature is increased to about 100°–220° C., and maintained for a minimum of 4 hours during pressure of 100–5,000 $kg/cm^2$.

f) After completion, the HgI$_2$ plate is removed from the mold. The upper palladium or gold can serve as electrode; however, it is preferably removed, and another electrode is deposited, in the form of strips or a continuous film of palladium, gold, carbon, germanium, etc.

2. Slurry Deposition

The process consists of the following steps:

a) As in step (a) of the hot pressing process.

b) As in step (b) of the hot pressing process.

c) The purified powders are mixed with an organic binder in a solvent, and deposited by painting, spraying, or printing on the substrate with bottom electrode.

d) The plate is heated to 60°–120° C., and removed.

e) As in step (f) of the hot pressing process.

3. Vapor Phase Deposition

The process consists of the following steps:

a) As in step (a) of the hot pressing process.

b) Purified HgI$_2$ is placed in the hotter space of a vacuum chamber, at 90°–220° C.

c) The substrate and lower electrode, as in step (b) of the hot pressing process, is placed in the LN$_2$-cooled end of the vacuum chamber.

d) HgI$_2$ is sublimed and deposited on the substrate.

e) A thermal heating and annealing to 50°–100° C. for 30–60 min. is done, after adding N$_2$ to the process to avoid re-evaporation of the HgI$_2$ phase.

f) The plate is removed. An upper electrode is deposited, as in step (f) of the hot pressing process.

The resulting detector plates, which can have any desired size and thickness, are covered by an upper metal electrode and can act as X-ray and nuclear radiation counters, in the energy range from 6–660 keV. The large-sized plates are particularly suited to be integrated into a large X-ray camera system, in which the analog photoelectric radiation signals can be countered to digital signals and used in a computerized, controlled imaging system which can store the necessary imaging information and be used, e.g., as a replacement for X-ray films in medical and dental applications, or in other imaging system applications. Thus, the present invention provides low-cost, large-area detectors which allow applications which were, until now, prohibitively expensive.

As is known, room temperature operating, X-ray or gamma ray radiation semiconductor detectors require a wide band gap. Table 1 below lists most known semiconductor detectors used today for this purpose [M. Schieber, et al., in: "Semiconductors for Room Temperature Radiation Detector Applications," R. B. James, T. E. Schlesinger, P. Siffert, and E. Franks, Eds., *Materials Research Soc. Sympos. Proc.*, Vol. 302, p. 189 (1993)]. In order to be operable at room temperature, the material requires a band gap, e.g., larger than ≈1.5 eV, in order to overcome thermal electronic noise. In order to have good stopping power and absorption of the radiation energy, and in order to be able to efficiently transport the electrical charge carriers produced by the radiation, it requires a high atomic Z number. The detector is required to have a large drift length $\lambda$, which is the product of the charge carriers' mobility $\mu$, lifetime $\tau$ and electric field, $\epsilon$, wherein $\lambda=\mu\tau\epsilon$. The electric field depends on the electrical resistance: the larger the resistance, the larger the field which can transport the electrical charges.

From studying the semiconductor materials listed below in Table 1, it can be seen that the small band gap of the best-known semiconductor detectors Si(Li) and HPGe causes a need for cryogenic cooling and prevents room temperature operation, despite the excellent drift length. In addition, one can see that due to the low Z, one needs a much larger thickness of Si(Li) and HPGe in order to stop the radiation flux, as compared to all other detector materials except GaAs.

TABLE 1

Solid State Semiconductor x-ray and Gamma Ray Detectors

| Material | Band gap Eg (eV) | Atomic number $\underline{Z}$ | drift length $\lambda$ (mm) | Thickness required to stop 90% of 60 keV radiation | Electrical resistivity ($\Omega \cdot$ cm) | Melting point (° C.) |
|---|---|---|---|---|---|---|
| Si(Li) | 1.1 | 14 | $10^2$ | 130 | $10^2$–$10^4$ | 11410 |
| HPGe | 0.8 | 32 | $10^-$ | 2.6 | $10^3$–$10^9$ | 947 |
| CdTe | 1.5 | 50 | 10 | 0.5 | $10^9$ | 1041 |
| HgI$_2$ | 2.1 | 62 | 10 | 0.4 | $10^{13}$ | 259 |
| CdZnTe | 1.7 | 48 | 10 | 0.5 | $10^{11}$ | 1080 |
| GaAs | 1.5 | 32 | 1 | 2.6 | $10^7$ | 1238 |
| PbI$_2$ | 2.6 | 63 | 1 | 0.4 | $10^{14}$ | 402 |

Among the large band gap materials, HgI$_2$ and PbI$_2$ [J. Zhang, et al., *Nucl. Intsr. and Meth.*, Vol. A322, p. 499 (1992)] have the largest atomic number and hence the best absorption capability, as can be seen in Table 1. Another technological consideration is the temperature at which the material is produced. The lower melting point simplifies and lowers the cost of production of HgI$_2$ and PbI$_2$ detectors, relative to the other semiconductors listed in Table 1. Nevertheless, as mentioned above, the cost of single crystal production of HgI$_2$ is very high since these crystals must be grown only from the vapor phase [M. Schieber, et al., *J. Cryst. Growth*, Vol. 65, p. 353 (1983)], which takes approximately 3 months for larger crystals. PbI$_2$ crystals can be used only for very small detector crystals having an area of several mm$^2$ and a very small thickness [V. M. Gerrish, in: *Semiconductors for Room Temperature Radiation Detector Applications*, R. B. James, T. E. Schlesinger, F. Siffert, and E. Franks, Eds., *Materials Research Soc. Sympos. Proc.*, Vol. 302, p. 189 (1993)], which do not absorb much radiation.

The present invention is based on the replacement of high-cost, single crystal radiation detectors which act as spectrometers and can identify the energy of the incident radiation, with low-cost detectors produced from polycrystalline films having the same large band gaps as the single crystals of the same materials. The replacement is pertinent for applications in which the radiation flux has to be measured without identification of the energy, since either the energy is known, or the knowledge is not significant. Such detectors are called radiation counters, since they count the radiation events. Counters are fabricated from lower quality, single crystals, which are produced in the same, very expensive fabrication process as the higher quality spectrometers. In applications in which large-area detection systems are required, such as for imaging purposes, large single crystals of, e.g., HgI$_2$, of a size of about 50×50 mm, have to be sliced and polished, causing a loss of about 60% of the total volume of the crystal. The slices are then placed side-by-side in a large mosaic, until the desired size of the detecting system is reached. Such an imaging system is very expensive, due to the long time required to produce and slice the crystals and then to mosaic them into a large-area detection system.

In an especially preferred embodiment of the present invention, there is provided an energy dispersive x-ray and gamma ray imaging system, based on semiconductor thin film detectors.

X-ray imaging is applied in medical diagnostic systems such as those used in x-ray radiography, x-ray computed topography (CT), single photon emission computed topography (SPECT), and position emission topography (PET). In addition, x-ray imaging systems are also used in astronomy and astrophysics for mapping x-ray fields, solar flare imaging, x-ray sky surveys, and surveys of various galactic regions from satellite-borne instruments.

Many types of image receptors are used for modern x-ray imaging systems. These include direct-exposure x-ray films, image plates, image intensifiers, gas field ionization chambers, scintillation detector systems, high purity germanium, and Si(Li) systems. The absorption efficiency, energy resolution and cooling requirements are shown in Table 1 below, and all image receptors show good spatial resolution.

The image receptors shown in Table 2 are two-dimensional (2D), such as x-ray films, image plates and image intensifiers, and bulk detectors such as gas ionization counters, scintillators and semiconductor or radiation detectors [Si(Li)], $HgI_2$, CdTe and CdZnTe.

TABLE 2

Absorption Efficiency, Energy Resolution and Cooling Requirements for Ray-Imaging Devices

| | XR Films | Image Plates | Image Intensifiers | Gas Ionization Counters | Scintillators | HPGe Si[Li] | $HgI_2$ CdTe CdZnTe |
|---|---|---|---|---|---|---|---|
| Absorption efficiency | Poor | Ave. | Good | Poor | Good | Good to Poor | Good |
| Energy resolution | None | None | None | Poor | Poor | Poor | Good |
| Cryogenic Cooling | No | No | No | No | No | Yes | No |

The absorption efficiency depends strongly on the atomic number Z, which is higher for $HgI_2$ than for all other solid state detectors listed in Table 1. The energy resolution is best for semiconductor detectors which directly convert the x-ray photons into electric charges, contrary to scintillators which convert the x-ray photons into visible light which is afterwards converted electronically with diodes or photo-multipliers into electrical charges. Cryogenic cooling is required for semiconductor detectors which have a smaller energy band gap Eg, such as high purity Ge (HPGe) with Eg≈0.8 eV and Li drifted Si [Si(Li)] with Eg≈1.1 eV. $HgI_2$, CdTe and CdZnTe have an Eg of 2.2, 1.45 and 1.50 eV respectively, which are large enough to allow room temperature operation without cryogenic cooling.

From the various image receptors shown in Table 2, it is obvious that the high Z and high Eg semiconductor radiation detectors combine the optimal properties required for x-ray imaging applications. The only literature reported so far for imaging applications is in the field of gamma ray camera using bulk detectors of $HgI_2$, using 8 by 8 pixels [C. Ortale, et al., *Nucl. Inst. and Methods*, Vol. 213, p. 95 (1983)] and progressing to a 32 by 32 pixel array [see, e.g., B. E. Patt, et al., *Nucl. Inst. and Methods*, Vol. 283, p. 215 (1989)] with a pixel size of 0.8×0.8 mm² and a thickness of 2 mm, with interelement spacing of ≈2 mm. The latter camera has a front end area of 5×5 cm². No such cameras are reported for CdTe or CdZnTe, due to manufacturing problems which still remain in producing high quality and uniform single crystals.

The difficulties encountered in producing a bulk $HgI_2$ imaging array are: (a) Growth of very large crystals, from which large-sized slices can be cut, is very difficult and time-consuming. It takes 2–3 months for one large crystal to grow. (b) The crystals have to be sliced using KI aqueous solution, which gives very uneven surfaces requiring polishing, causes over 60% loss of material, and introduces structural imperfections caused by the slicing and polishing operations.

In contradistinction to the prior art systems used and suggested to date, the present invention, instead of growing a three-dimensional crystal and then slicing and polishing the slices, is based on depositing a thin, continuous film of a semiconductive radiation-detecting material on a conductive substrate.

More particularly, the present invention provides an image receptor for an imaging system comprising a thin, continuous film of a wide band gap, semi-conductor radiation-detecting material deposited on a conductive substrate layer forming a bottom electrode, said film being covered by an upper conductive layer forming an upper electrode; wherein at least one of said layers is provided with a plurality of conductive areas separated from each other by a plurality of non-conductive areas, and wherein a multiplicity of said conductive areas are individually, respectively connected, via a charge-sensitive pre-amplifier, to an imaging electronic system.

As indicated in a first preferred embodiment of the present invention, either said bottom electrode or said upper electrode is subdivided into a plurality of conductive areas separated from each other by non-conductive areas, e.g., said substrate can be continuously covered by a grid of top-patterned electrode pixels of ≈20–200 μm width and ≈20–200 μm length, each detector connected individually to the electronic circuit.

In a further preferred embodiment of the present invention, said imaging system comprises a thin, continuous film of a wide band gap, semiconductor radiation-detecting material deposited on a substrate layer having a plurality of conductive areas separated from each other by a plurality of non-conductive areas forming a bottom electrode, said film being covered by an upper layer having a plurality of conductive areas separated from each other by a plurality of non-conductive areas.

Preferably, in said embodiment the conductive areas of said substrate layer are arranged as a first series of spaced-apart strips and the conductive areas of said upper layer are arranged as a second series of spaced-apart strips, said first and second series of strips being arranged relative to each other to form a grid-like array.

Especially preferred is an arrangement wherein said upper and substrate layers are respectively patterned with vertical and horizontal conductive strips, to produce a cross-grid representing a pixel of about 20–200 μm width and about 20–200 μm length.

Thus, the present invention now provides a new x-ray and low-energy gamma ray system based on semiconductor thin films rather than bulk crystals. The system operates mainly in energy-dispersive mode, but can also be used in the current mode. It is based on room temperature operating, large band gap semiconductor radiation detectors, such as $HgI_2$, CdTe, CdZnTe or $PbI_2$, deposited as evenly textured films of 1 to 100 μm thickness, either on patterned, more conductive semiconductor substrates such as Si, Ge or GaAs, which can serve directly as the bottom electrode, or on insulating substrates such as MgO or sapphire ($Al_2O_3$) which are coated prior to deposition with patterned conducting (gold or palladium) stripes, which should also serve as the bottom electrode. The width of the stripes is 10–100 μm.

Since the preparation of $HgI_2$ textured films has never been reported, the present invention also relates to a novel thin film deposition system. As mentioned above, the semiconductor film is then coated with conducting (gold or palladium) patterned stripes which represent the top electrode. The detector system is then passivated by coating with a very thin layer of paralene, humiseal, or other inert coating, and via printed circuit it is connected to a low noise, high voltage power supply to bias the detector system and to the electronic measuring system.

The use of semiconducting bulk crystals radiation detectors has been recently described in U.S. Pat. No. 5,245,919. The semiconductor material chosen is CdZnTe. This system is designed for gamma ray topographic imaging systems. The principle is that collimated τ-rays are detected by a semiconductor rather than by a scintillation crystal camera (usually sodium iodide). The semiconductor transforms the attenuated τ-rays directly into electrical charges rather than first transforming the into visible light, and afterwards, through a photomultiplier or diode, transforms the visible light into electrical charges.

In contradistinction to the teachings of said patent, the novelty of the present approach is to use thin films rather than blocks of bulk crystals and a wide range rather than collimated radiation.

Other methods of imaging which also do not teach the novel feature of the present invention include:

a) A photocapacitive image converter described in U.S. Pat. No. 4,331,813. This patent is based on a Metal-insulator-semiconductor, in which the semiconductor is Si, Ge or GaAs. The radiation is then converted into electrical signals. The disadvantage of this method is that it does not discriminate the nuclear radiation and in fact can be used for any kind of radiation; and b) Multi-Element-Amorphous-Silicon-Array for real time imaging described by U.S. Pat. No. 5,079,426. This method is based on a thin film field effect transistor, a dielectric larger and amorphous silicon which converts the radiation into signals. As in the case of the photoconductive method, this method is not specifically designed for nuclear radiation and instead measures any wide range radiation, including infra red radiation.

The present description will be limited to the energy-dispersive mode rather than the current mode.

The electronic counting system consists of a pulse count system, by which each of the bottom electrode stripes (rows) and top electrode stripes (columns) is connected to a first stage, charge-sensitive, low noise hybrid (or asic) preamplifier, which is further amplified by a shaping amplifier. The collected charges are compared, discriminated and converted from analog to digital signals, stored in a computer, and the computed image is displayed. At 100 keV, the semiconductor films detector can stop between ≈0.1–10% of the radiation, depending on the thickness of the film. All problems, particularly the conversion of bulk detector to thin film camera, are addressed and resolved.

The front end of the camera, which is 5×5 cm², is composed of 300 vertical and 300 horizontal stripes, 100 μm×5 cm each, separated by 66 μm uncoated stripes. Thus, there are 90,000 intersections of horizontal and vertical stripes in one camera module, having a total of 90,000 pixels per 5×5 cm² detector front end plate. For imaging larger areas, such as for X-ray imaging mammography where 20×15 cm² plates are used, 12 interconnected 5×5 cm² modules can be assembled.

The invention will now be described in connection with certain preferred embodiments with reference to the following illustrative figures and examples, so that it may be more fully understood.

With specific reference now to the figures and examples in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings and the given examples making apparent to those skilled in the art how the several forms of the invention may be embodied in practice.

As stated above, the present invention is based on using any of the semiconductor materials listed in Table 1 as polycrystalline detector materials. That means that, instead of growing the crystals as single crystals in a very lengthy, time-consuming cycle, which can take many months as in the case of $HgI_2$, the present invention provides techniques which produce $HgI_2$ or other semiconductors as polycrystalline ceramic materials, of any desired thickness and size, in a maximum length of time of about 24 hours.

Figure 1:
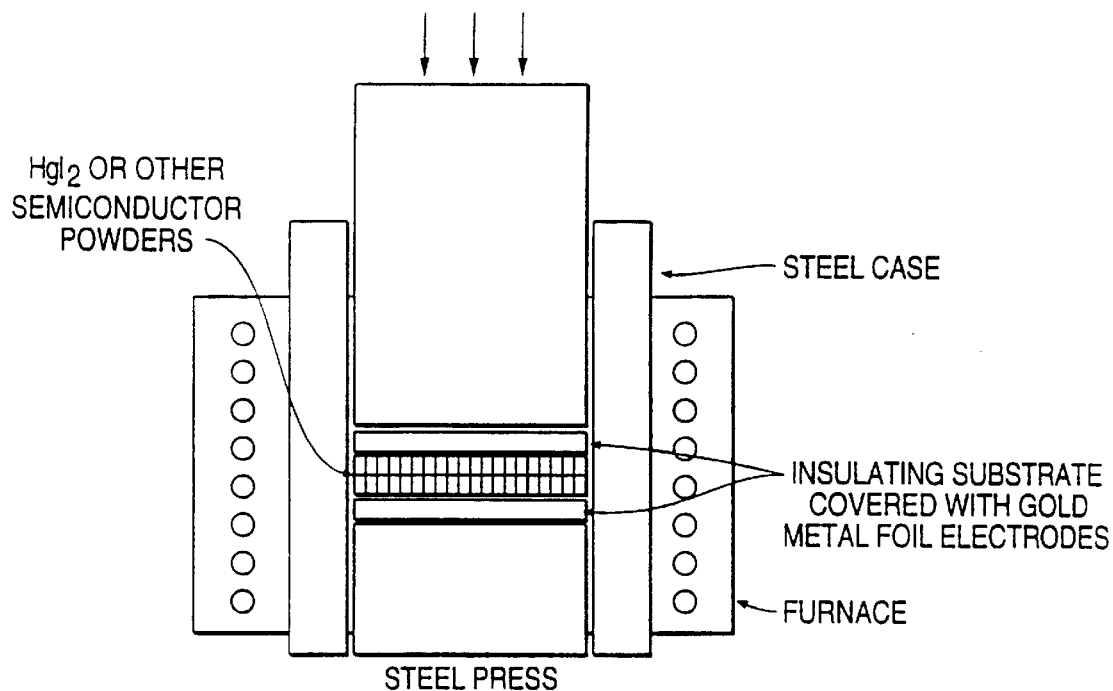
FIG. 1 is a schematic drawing of the hot pressing system for producing semiconductor polycrystalline plates.
Figure 2:
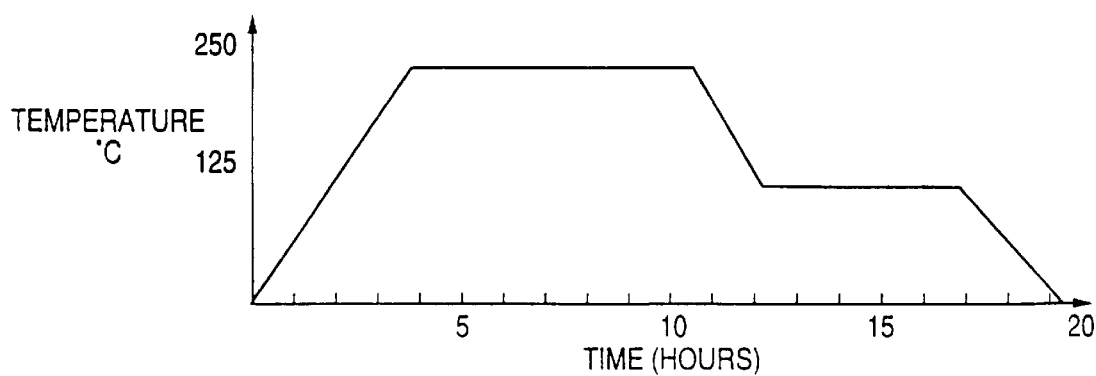
FIG. 2 is a graph showing the time profile of the hot pressure heat treatment for mercuric iodide or lead iodide.

The process is based on either hot pressing or slurry deposition of the semiconductor powders such as $HgI_2$ or $PbI_2$ mixtures with organic solvents such as alcohol, $CCl_4$, or special polymers used as binders, having long molecules and deposited by painting or spraying, followed by drawing or screen printing annealing in a temperature range below the temperature of phase transformation or melting point. Polycrystalline, purified, $HgI_2$ powder material is preferably used in both cases. In the hot pressing technique, the powder is subjected to a pressure of about 907 kg/cm² in a press, as shown in FIG. 1, and then heated while under pressure in the thermal cycle shown in FIG. 2. This high pressure prevents evaporation of $HgI_2$, which has a high vapor pressure (its boiling point is 354° C.), and the annealing temperature of approximately 220° C. allows a recrystallisation of the strained grains. The sintering produces a very high density process, so that the produced $HgI_2$ plate can be contacted by the upper and lower electrodes and can withstand the reasonable bias voltage (≈10⁴V/cm) required to collect the electrical charges produced by the radiation. Since $HgI_2$ undergoes a destructive phase transformation at 125° C., it requires an additional annealing time at about that temperature, as shown in FIG. 2.

Other advantages of the hot pressing technology are that the detector plates thus produced are very compact; they have a very high density, and their size and thickness is only limited by the size of the die and the total pressure generated by the press. The upper electrodes of the $HgI_2$ plates are made with gold, palladium, germanium, or silicon, and may be of any desired shape.

Figure 3:
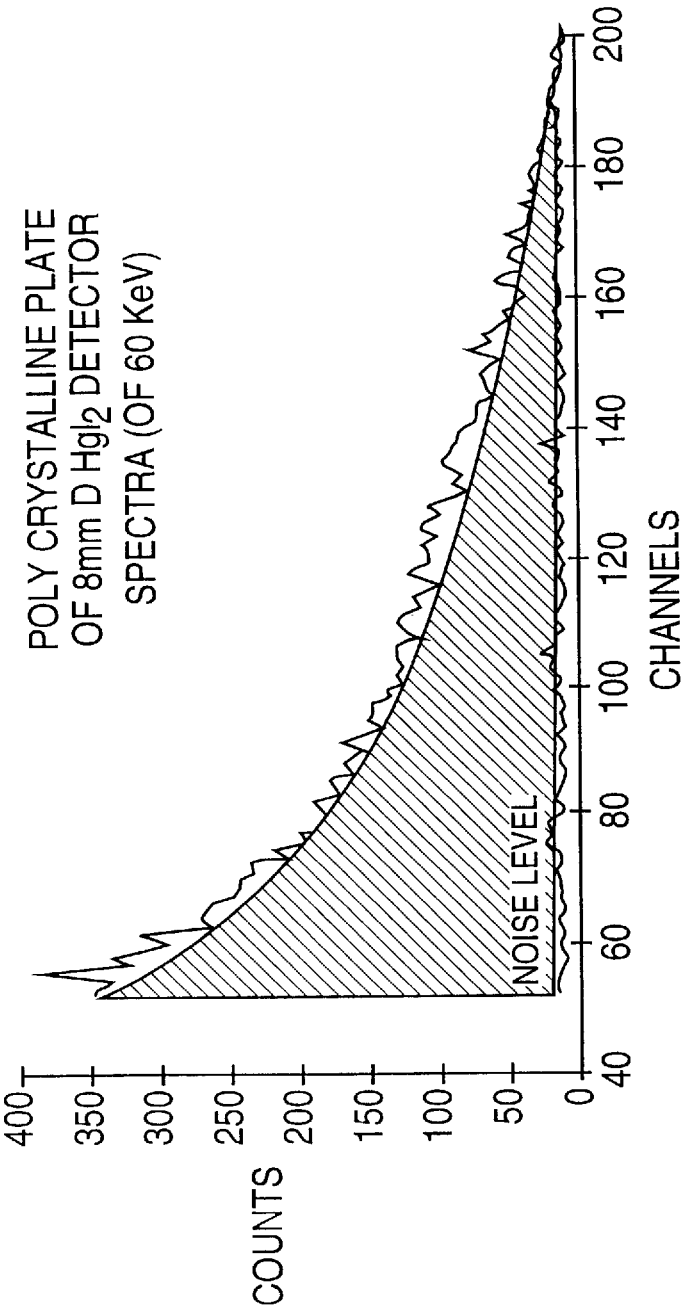
FIG. 3 shows an example of radiation response to 60 keV gamma radiation of a polycrystalline $HgI_2$ detector plate produced according to the method of the present invention.

An alternative method of generating large-area polycrystalline detector sheets is by slurry deposition. Purified polycrystalline powder is mixed with an organic binder, such as polyvinyl acrylate and trimethyl sorbitant in equal amounts, dissolved in a 65% ethanol/water solution, and then deposited by spraying, painting, spinning, or screen printing on an insulating substrate, which can be either polycrystalline alumina, TEFLON, or a metal electrode such as platinum or gold, or semiconductor such as silicon or germanium, already patterned with additional electrical contacts such as palladium or gold electrode strips or other shapes of electrodes. The substrate plate and the slurry-deposited suspension of semiconductor powder are then heated at 50°–95° C. to evaporate the alcohol in atmosphere and then heated, in the case of $HgI_2$ to approximately 110° C., for a heat treatment of from 4–24 hours. The inert, contacted $HgI_2$ plate is then introduced into a dark metal box, lined inside with TEFLON insulation, and the radiation-receiving end is covered with a carbon or very thin aluminum foil window. The detector box is then connected to an electronic read-out system. An example of the radiation response of such a polycrystalline $HgI_2$ detector plate to 60 keV gamma radiation is shown in FIG. 3. If compared with a single $HgI_2$ crystal of similar size and thickness, the polycrystalline $HgI_2$ detector plate produced according to the present invention detects about 15% relative to the amount of radiation detected by the single crystal spectrometer.

EXAMPLE 1

30 mg of high purity $HgI_2$ powders, reduced to a grain size ≈5–10 micrometer, were placed in a steel mold on a gold foil of 6 mm diameter. The powder was covered by another gold foil of similar size, and then pressed. Under pressure, the temperature was raised to 110° C. for 10 hours, and then slowly lowered to room temperature for 10 more hours. The $HgI_2$ plate thus obtained was sintered to the gold plates. The gold foils could serve as electrodes, or, if removed, the $HgI_2$ plate could alternatively be coated by graphite suspension ("Aquadag") on both sides, to be used as the electrode contacts, dried, and then very thin Pd or Pt wires of 0.1 mm diameter attached to both electrodes with "Aquadag" and dried. In Example 1, the gold foils were left to serve as the electrodes.

After introduction into the testing chamber (FIG. 2), the produced plate showed a response to X-rays as shown in FIG. 3.

All further examples also showed an X-ray response similar to that shown in FIG. 3.

EXAMPLE 2

The procedure of Example 1 was repeated; however, the $HgI_2$ plate was separated from the gold foils, and Pd contacts were evaporated, as shown in FIG. 1.

EXAMPLE 3

The procedure of Example 1 was repeated; but the heating cycle during hot pressure was 10 hours at 200° C., with cooling to 127° C. for 10 hours, and then slowly cooling to room temperature.

EXAMPLE 4

The procedure of Example 1 was repeated; but the gold substrate was replaced with sintered alumina 2 mm thick, coated with patterned gold strips, as shown in FIG. 1.

EXAMPLE 5

The procedure of Example 1 was repeated, using TEFLON-coated metal foils, which are easier to separate from the $HgI_2$ plate. The electrodes were coated as in Example 2.

EXAMPLE 6

The procedure of Example 5 was followed, using glass plates coated with electrodes on the top and bottom in the steel mold.

EXAMPLE 7

The procedure of Example 1 was followed, using larger grains (≈1 mm) of $HgI_2$, obtained by purification after vacuum evaporation of $HgI_2$ non-purified powders.

EXAMPLE 8

The procedure of Example 7 was followed, using purified lead iodide instead of $HgI_2$. A $PbI_2$ plate was produced.

EXAMPLE 9

100 mg of $HgI_2$ powder was mixed with polyvinyl metacrylate and trimethyl sorbitate. The mixture was painted on the substrate, dried for about 2 hours, and heat-treated at 120° C. for one hour. The upper electrode of Pd was then deposited, and the sample was introduced into the testing chamber (FIG. 2). The results were similar to those of FIG. 3.

EXAMPLE 10

The procedure of Example 9 was followed, using a glass substrate of 1 mm thickness, prepatterned as shown in FIG. 1.

EXAMPLE 11

The procedure of Example 10 was followed, but using a gold substrate having a thickness of 0.5 mm.

EXAMPLE 12

The procedures of Examples 9, 10 and 11 were followed, but evaporating Pd or Au electrodes on the $HgI_2$ plate, patterned as shown in FIG. 1.

EXAMPLE 13

The procedure of Example 9 was followed, but applying a thick layer of $HgI_2$, mixed with the organic binder by using the spinning method, similar to the way in which photoresist solution is applied during a photolithography process. The alumina substrate, covered with the bottom electrode, was spun at 5,000 rpm. A small amount of the slurry mixture, enough to apply a layer approximately 100 $\mu$m thick, adhered to the substrate. The rotational speed used enabled the slurry layer to be very flat and homogeneous. The upper contacts were applied as in the other examples, and the plate was tested for X-ray response.

EXAMPLE 14

The procedure of Example 13 was followed, but the deposition of $HgI_2$ was made with a commercially available spraying system using air pressure and a nozzle, through which the slurry was sprayed on the precontacted glass plate.

EXAMPLE 15

$HgI_2$ powders were placed at the bottom of a glass vacuum chamber, heated to about 100° C., and deposited by evaporating an $HgI_2$ layer on a liquid $N_2$-cooled glass substrate, precontacted with the bottom electrode, yielding an $HgI_2$ layer 1–50 μm thick. The temperature was then slowly raised while the vacuum was released and replaced by 1 atm. of $N_2$, slowly heated to 50° C., and then cooled to room temperature. The $HgI_2$ polycrystalline plate was then covered with the upper electrode, and tested for response to the x-ray radiation.

EXAMPLE 16

The procedure of Example 15 was followed, but other substrates were used, such as germanium or sintered alumina, and the bottom electrodes were pre-patterned by palladium or gold strips.

EXAMPLE 17

A mixture of $HgI_2$ and binder was placed in a container having a sieve at the bottom with an area of ≈20×30 $cm_2$ and holes of a size of ≈250×250 $μm_2$, through which said mixture can pass. The mixture was then squeezed through the sieve by either manual or machine press, and printed on a substrate of glass or alumina which was previously evaporated with 100 μm-width metal electrodes in horizontal rows, of Au, Pd or Pt. A thickness of approximately 40 μm of $HgI_2$ was thus obtained; by repeated printing, a thickness of 100 μm can be reached. The film was then annealed at 60° C. for 5 hours. The upper vertical columns of electrodes, also 100 μm wide, were applied on thin glass or plastic foil by evaporation, and superposed on the $HgI_2$ thick film by mask alignment. Thus, active pixels of 100×100 $μm^2$ were formed at the intersections of the horizontal and vertical electrodes.

Figure 4:
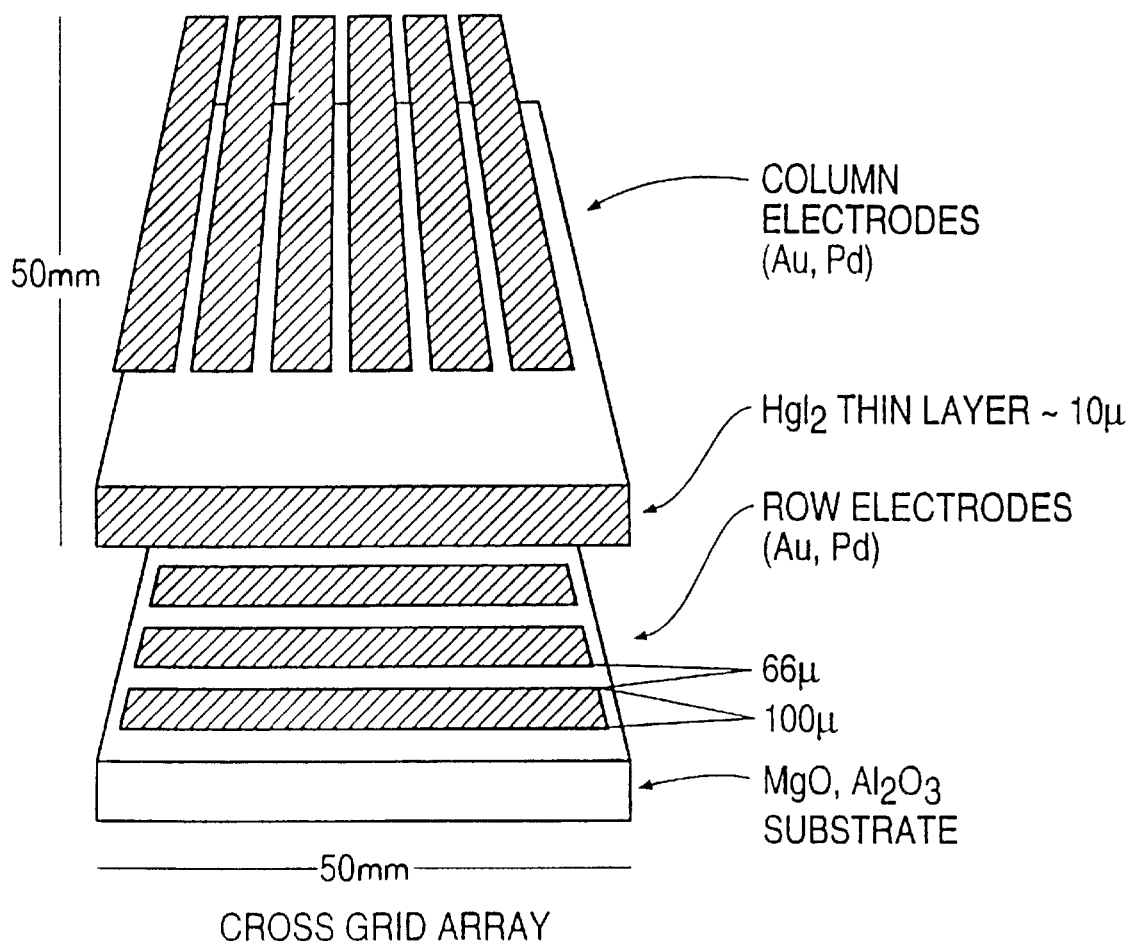
FIG. 4 is a photolithograph of a multi-layer metal/$HgI_2$/metal thin film structure, showing 50×50 mm² pixels.
Figure 5:
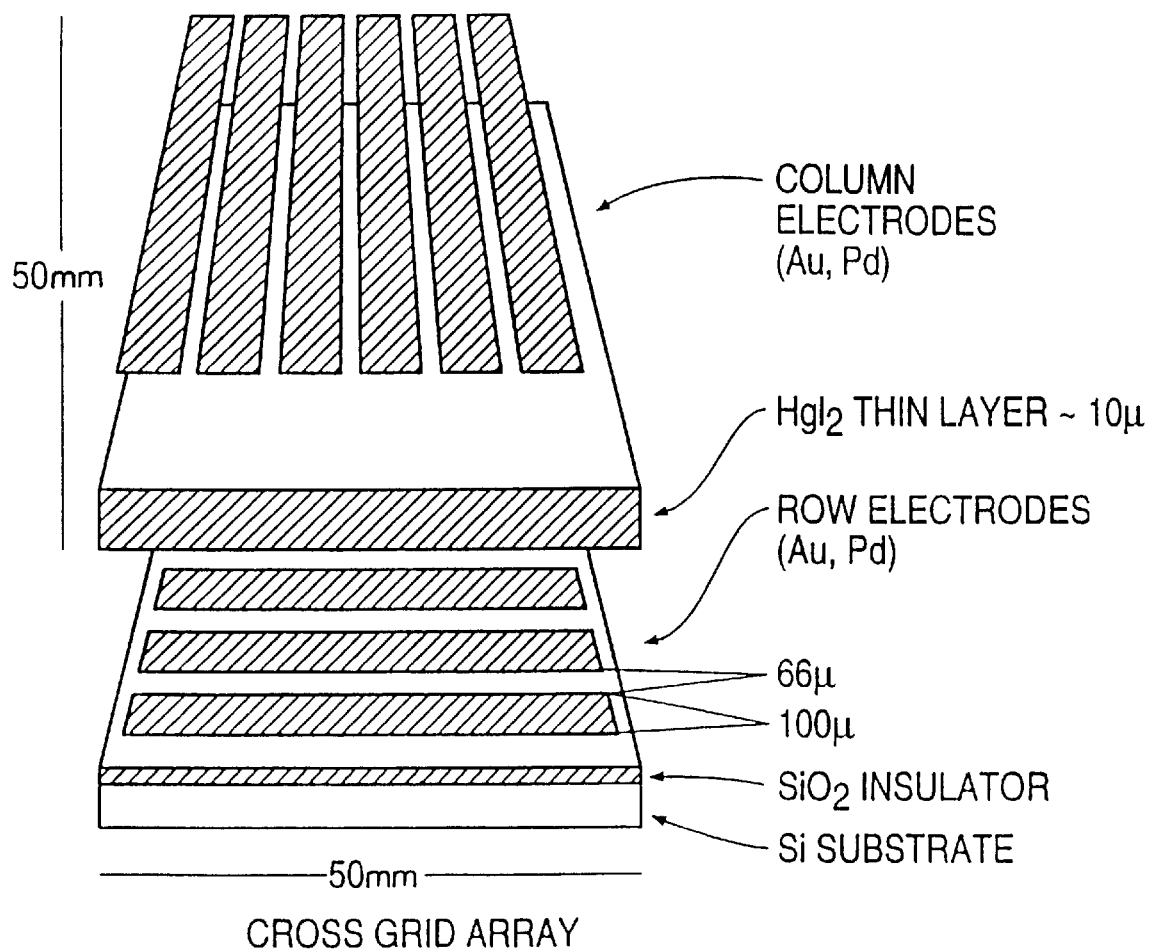
FIG. 5 is a photolithograph of a multi-layer Si/$HgI_2$/metal thin film structure, showing 50×50 mm² pixels.

Referring now to FIGS. 4 and 5, there is seen a thin film of $HgI_2$ deposited on a thin gold or palladium metallized, insulating, single crystal substrate such as MgO or sapphire (FIG. 4), or on a semiconducting substrate such as Si or Ge (FIG. 5), both of which are 50×50 $mm^2$ in dimensions. The $HgI_2$ film is patterned bottom and top with horizontal and vertical stripes respectively, of 100 μm×50 mm length and separated by 66 μm contactless stripes, yielding 300×300 pixels, with or without guard rings.

The advantages of the system of the present invention are a much lower production cost, and the ability to produce large-area imaging detectors consistent with modern thin film technology. The lower cost is based on the much shorter time required to produce an $HgI_2$ film on a substrate (FIGS. 4 and 5), rather than that required to grow, slice and polish the large crystals, i.e., 2–3 hours as compared to 2–3 months.

The disadvantage of the thin film detection system is a smaller absorption of only 0.1–1.0% of the total radiation, against 100% of the bulk crystals (for 100 key radiation). However, even such a low absorption of radiation by the thin films allows achievement of spectral resolution comparable with x-ray films (Table 2), which also absorb less than 0.1% of the total radiation although spectral resolution is not required to characterize the counts per pixel.

$HgI_2$ and also other semiconductor detectors such as CdTe and CdZnTe, can be used not only in direct imaging as x-ray films, but also in both current mode and energy dispersive imaging systems. The latter allows measurement of very small numbers of interactions in the detector, also decreasing total exposure to high doses of radiation. Energy dispersive imaging also allows counting of radiation events by analog electronics, and, by analog-to-digital conversion, digitizing of information and storage of same in a computer-to-image display.

Figure 6:
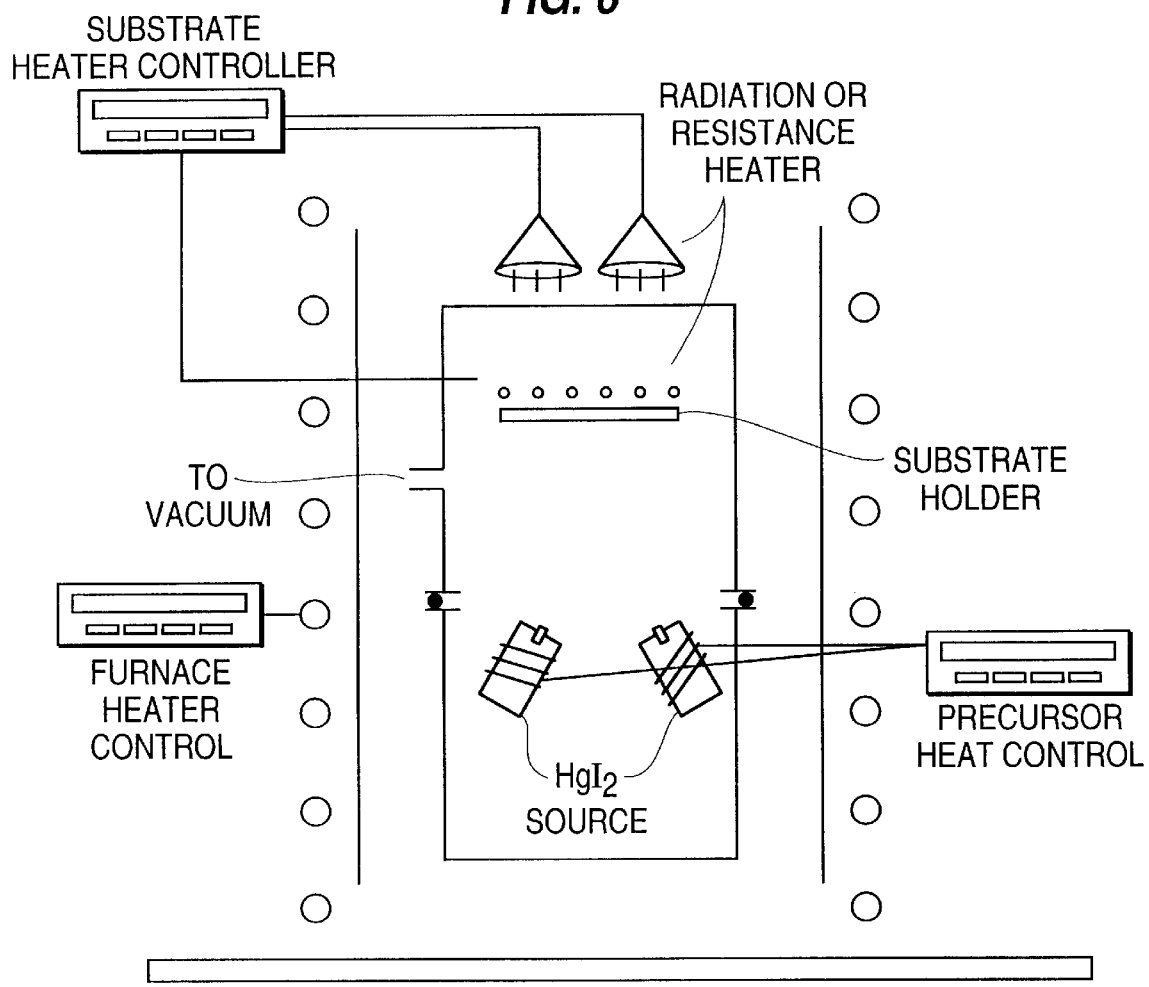
FIG. 6 is a schematic view of a $HgI_2$ thin film deposition system.

FIG. 6 depicts a thin deposition system apparatus which can be used by (a) direct evaporation of $HgI_2$; (b) separate evaporation of Hg and $I_2$ and condensation on the substrate; or (c) chemical vapor deposition, such as $Hg(tdh)_2$ precursor and $I_2$ compounds. The apparatus consists of a two-part, vertical Pyrex® or quartz ampoule connected to a vacuum system. In the bottom part of the ampoule is the precursor source section, containing either highly-purified $HgI_2$ or, in different separate sub-containers, Hg metal, inorganic or Organometallic Hg compound, and free iodine. The temperature is controlled in the bottom part by $T_{precursor}$, which is separately monitored. The upper part of the ampoule contains a substrate holder, to which the semiconductor or metallized and patterned substrate is attached. The substrate holder is locally heated by a resistance heater (not shown) or by radiative heating, which determines $T_{subst}$, the temperature of the substrate. In order to provide the hot wall environment, the Pyrex® or quartz ampoule is introduced in a separately controlled, semi-transparent resistance furnace, the temperature of which is called $T_{furnace}$.

The deposition conditions are fulfilled if $T_{furnace} > T_{precursor} > T_{subst}$. Typical temperatures used are $T_{furnace}=130°$ C., $T_{precursor}=125°$ C., and $T_{subst}=115°$ C.

For substrates larger than 50×50 $mm^2$, the system has to be scaled up, and the substrate has to be moved by a mechanical x-y driving system to assure homogenous deposition. Other wide band gap semiconductors, such as CdTe and CdZnTe, are available as thin films on substrates such as Si with GaAs layers, on top of which either CdTe or $Cd_{1-x}Z_xTe$ layers are deposited, with x≈0.05 or 0.20. These CdTe/GaAs/Si multilayer structures are being used as substrates for CdHgTe infrared detectors, but can also be used for thick film X-ray detectors if they are patterned to the desired number of bottom electrode stripes, to provide the proper number of imaging pixels. Thin films of $PbI_2$ can be deposited in an apparatus similar to that shown in FIG. 6.

The semiconductor thin films described above are patterned by photolithography for the vapor phase deposition of the top metal electrode stripes, made of palladium, gold or platinum. After photolithography, the finished detector structures (see FIGS. 4 and 5) are thoroughly rinsed in high purity, deionized and triple-distilled water, to remove the chemicals left from the photolithography process. The structures are then passivated by covering with a thin layer of paralene, after which they are ready for packaging for electronic readout.

The patterned, contacted and passivated detector plate, measuring 5×5×0.2 $cm^3$, is then placed on a polycrystalline alumina or TEFLON plate which has the printed circuit board contacts on the bottom thereof. The plate serves as the first stage of amplification, composed of a low noise 2N4416 FET and a low noise feedback resistor, mounted on a ceramic chip of 0.5×0.5×0.1 $cm^3$ preamplifier substrate. The module is composed of stripes of 100 μm×5 cm each, separated by 66 μm non-contacted stripes. The horizontal stripes are called rows, and the vertical stripes are called columns. There are 300 rows and 300 columns. The total number of preamplifiers required for one camera module is 600 i.e., each row and each column is connected to its own preamplifier. In order to house 600 hybrid preamplifier chips and allow the use of several modules, the front end of the camera plate, with 100 preamplifier chips, is placed on top of a cube-shaped box accommodating 100 chips per face (the four side walls and bottom wall thus housing together 500 chips, +100 chips on the top). The walls of the box are connected by a preprinted circuit board, which is connected on one side to the input of the detector and the bias voltage, and on the other side to the preamplifiers output connected to the remaining electronic circuitry, which is similar to that described below for the $HgI_2$ bulk detector camera (see FIG. 7).

Figure 7:
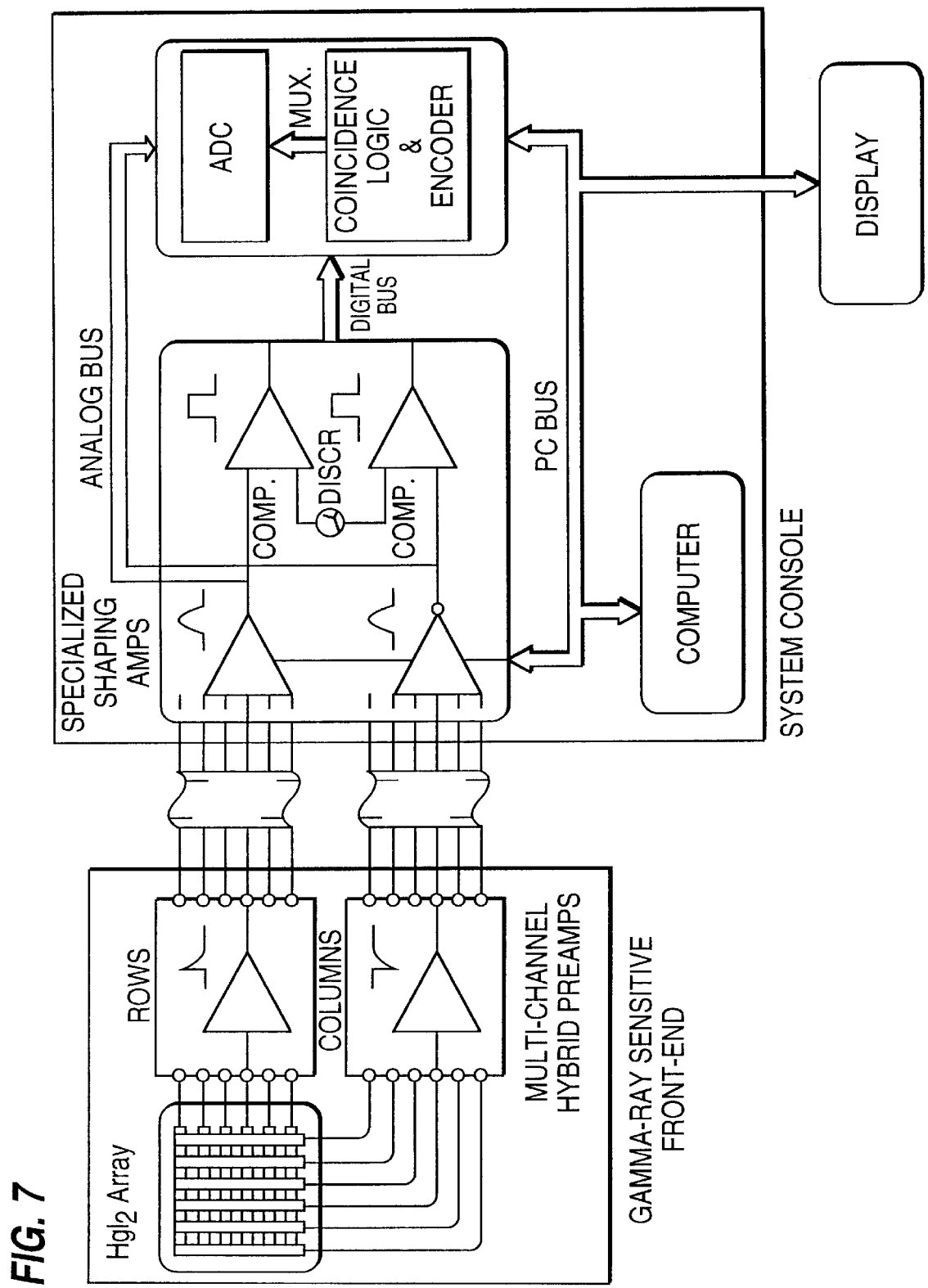
FIG. 7 is a block diagram of the electronic system of a bulk $HgI_2$ detector camera, adapted to a thin film detector camera.

Referring now to FIG. 7, the electronic system used for the HgI$_2$ bulk detector crystal camera will be briefly described in order to present a more complete description.

The overall electronics are adapted for the thin film detector of the present invention. Thus, the detector output from the preamplifier is further amplified and shaped, and collected charges are transferred from the preamplifier to the shaping amplifier, which is a hybrid designed to be flexible enough to be used with other pulse-oriented radiation detector systems. A single stage of differentiation and four stages of active integration are used to achieve near Gaussian shaping. A high-impedance analog input buffer is provided, which may be used or bypassed. A 6 $\mu$s pole-zero cancellation circuit is included, but this value may be easily changed by adding an external variable resistor.

The output of the shaping amplifiers is processed in the following way: The signals are compared, using a fast comparator with a level discriminator set just above the noise in order to produce a digital signal, indicating that an event has occurred. This signal is then passed to an analog-to-digital dataway-to-logic circuit, which determines the validity of an event by coincidence timing. If the event is determined to be valid, it encodes the spatial position of the event and produces the appropriate multiplexer control signal so that the analog signal can be processed by the analog to digital converters to determine the pulse height (energy information). All of the encoding logic is realized using programmable logic arrays (Altera EP 1800J). This allows for significant reduction in the size of the final circuit over full-size discrete gate logic. All of the encoding logic and the ADC functions fit onto a single AT size card.

The entire data acquisition is supervised by an IBM PC-AT computer. The computer is a single AT size board (TI80486), with a second card used for I/O control (SCSI, etc.). The board is equipped with 10 MB of RAM. A 200 MB IDE drive, and a 1.4 MB, 3.5-inch floppy disk drive, are also included in the final system.

A custom system board, including the standard AT backplane and additional busses for the camera signals, is built to hold the cards making up the camera system. The cards fit into a subchassis in the back end of the camera. The high voltage power supply for biasing the detector, the low voltage power supply for the electronics, the hard disk drive, and the floppy disk drive, are mounted in a separate sub-chassis in the back end of the camera. The system is capable of input rates exceeding 10$^4$ counts per second.

Finally, the camera system includes software to control the data acquisition and display images. The software is written in the "C" language for OS/2, using the OS/2 presentation manager as the interface. A special driver is written to allow the software to communicate with the electronics.

The computer display during image acquisition can use the following item selection:

1) File I/O (save, load, etc.)
2) Acquisition parameters, such as time/count limits
3) Operating modes, such as choice of display of acquired image vs. reconstructed image, type of reconstruction, etc.
4) Options
5) Utilities
6) Help functions, intended to be compatible with the OS/2 PM, and allowing OS/2 PM conversion as much as is practical.

The display consists of the following distinct areas:

a) Menu area
b) Gray scale image display
c) Spectrum (daughter window)
d) Image characteristics (total count; sum of all counts; maximum counts; value of brightest pixel; multiple counts; number of counts where signals are present in two adjacent rows or columns simultaneously, due to charge splitting; delta counts, and number of counts.

The system includes mouse control, so that the user may select a particular pixel and display the energy spectrum for that pixel. The spectrum is displayed in the daughter window, which also shows the pixel location [r,c] to which the spectrum corresponds, the cursor location in the spectrum, and the corresponding number of counts [cursor; counts] at the location.

As will be realized, the present invention has many applications.

Thus, according to the invention, there is now provided a single module, miniature semiconductor, X-ray and gamma ray, thin film, radiation detector camera composed of HgI$_2$, CdTe, CdZnTe, or PbI$_2$ thin films, having a 5×5 cm$^2$ viewing window operating in current mode or in an energy dispersive mode.

The imaging system of the present invention can also be used with a multi-modular X-ray and gamma ray camera, replacing large area X-ray films of about 20×15 cm$^2$, i.e., composed of 12 modules of miniature cameras of 5×5 cm$^2$ or with a multi-modular, miniature, single module X-ray and gamma ray camera of 27.5×42.5 cm$^2$, i.e., ≈47 modules of 5×5 cm$^2$ or other radiology pictures.

The imaging system of the present invention can be applied in nuclear medicine, and can be used as an intra-operative tool for use in surgical procedures such as sub-clinical tumor removal, identification of transplant perfusion, determination of vascular graft viability, removal of benign bone lesions, etc. State of the art techniques available to the surgeon are limited to single-detector gamma and beta probes. The advantages of the imaging systems with respect to the non-imaging intra-operative probes include improvements in localization and sensitivity coupled with spectrally-resolved imaging, with potential for scatter subtraction.

Similarly, the present invention can be applied to astrophysics for mapping x-ray fields such as solar flare telescopes or gamma bursts; for use in identification of counterfeit banknotes; for use in identification and comparison of paintings in museums; for use in identification and comparison of antique archeological artifacts; for use in imaging of ground meat in canned meat to identify undesired bones; for use in identifying nuclear waste; for use in identifying smuggled nuclear material, and for use in airport security imaging systems.

It will be evident to those skilled in the art that the invention is not limited to the details of the foregoing illustrated embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A radiation detection system, comprising a continuous film of a wide band gap semiconductor, radiation-detecting, polycrystalline material formed from a multiplicity of crystalline grains, wherein said grains are sintered together to form a single, coherent, continuous film.

2. A radiation detection system according to claim 1, wherein said single, coherent, continuous film is a mercuric iodide film.

3. A radiation detection system according to claim 1, wherein said single, coherent, continuous film is a cadmium telluride film.

4. A radiation detection system according to claim 1, wherein said single, coherent, continuous film is a cadmium zinc telluride film.

5. A radiation detection system according to claim 1, wherein said single, coherent, continuous film is a lead iodide film.

6. A radiation detection system according to claim 1, wherein said film has an area of between about $10^2$ cm$^2$ and $10^4$ cm$^2$.

7. A radiation detection system according to claim 1, wherein said film has a thickness of between about 1–500 $\mu$m.

8. An image receptor for an imaging system, comprising:
   a thin, continuous film of a wide band gap semiconductor, radiation detecting, polycrystalline material formed from a multiplicity of crystalline grains, wherein said grains are sintered together to form a single, coherent, continuous film which is deposited on a conductive substrate layer forming a bottom electrode, and which is covered by an upper conductive layer forming an upper electrode, wherein at least one of said layers is provided with a plurality of conductive areas separated from each other by a plurality of non-conductive areas, and wherein a multiplicity of said conductive areas are individually, respectively connected, via a charge-sensitive pre-amplifier, to an imaging electronic system.

9. An image receptor for an imaging system according to claim 8, wherein said substrate layer has a plurality of conductive areas separated from each other by a plurality of non-conductive areas forming a bottom electrode, and said upper conductive layer has a plurality of conductive areas separated from each other by a plurality of non-conductive areas.

10. An image receptor for an imaging system according to claim 9, wherein the conductive areas of said substrate layer are arranged as a first series of spaced-apart strips and the conductive areas of said upper layer are arranged as a second series of spaced-apart strips, said first and second series of strips being arranged relative to each other to form a grid-like array.

11. An image receptor for an imaging system according to claim 10, wherein said upper and substrate layers are respectively patterned with vertical and horizontal conductive strips, to produce a cross-grip representing a pixel of about 20–200 $\mu$m width and about 20–200 $\mu$m length.

12. An image receptor for an imaging system according to claim 8, wherein said conductive areas are separated from each other by a dielectric material selected from the group consisting of SiO$_2$, MgO, and Al$_2$O$_3$.

13. An image receptor for an imaging system according to claim 8, wherein said conductive substrate layer is covered with a uniform, thin film electrode a layer selected from the group consisting of palladium, gold, platinum and germanium.

14. An image receptor for an imaging system according to claim 8, wherein said conductive substrate layer is covered by a grid of top-patterned upper electrode pixels of about 20–200 $\mu$m width and about 20–200 $\mu$m length.

15. An image receptor for an imaging system according to claim 8, whenever used in an X-ray and gamma ray imaging system.

16. An image receptor for an imaging system according to claim 8, wherein said thin film is a CdTe thin film.

17. An image receptor for an imaging system according to claim 8, wherein said thin film is a HgI$_2$ thin film.

18. An image receptor for an imaging system according to claim 8, wherein said thin film is a CdZnTe thin film.

19. An image receptor for an imaging system according to claim 8, wherein said thin film is a PbI$_2$ thin film.

20. An image receptor for an image according to claim 8, wherein said film is deposited in a thickness of 1–100 $\mu$m.

21. A process for the preparation of a continuous film of a wide gap semiconductor, radiation-detecting, polycrystalline material, comprising:
   (a) preparing grains of polycrystalline powder material having a purity of at least 99.9999 (6N) %;
   (b) depositing said granular material on a conductive substrate; and
   (c) sintering said grains of polycrystalline material together, to form a single, coherent, continuous film.

22. A process according to claim 21, wherein said purified grains of polycrystalline powder material are prepared by evaporation in a vacuum medium.

23. A process according to claim 22, wherein said evaporation is carried out at a temperature of about 100°–300° C.

24. A process according to claim 22, wherein said purification is carried out by sequential repeated evaporation.

25. A process according to claim 21, wherein said purified grains of polycrystalline powder material from step (a) are mixed with an organic binder in a solvent, and then deposited on said substrate, followed by annealing at a temperature of about 60°–120° C.

26. A process according to claim 25, wherein said deposition is carried out by mask printing.

27. A process according to claim 21, wherein said purified grains of polycrystalline powder material from step (a) are placed in a heated area of a vacuum chamber at a temperature of about 90°–220° C., and said conductive substrate is placed in an LN$_2$ cooled area of said vacuum chamber, whereby said purified granular material is sublimed and deposited on said substrate, and said sintering is carried out by heating and annealing at a temperature of about 50°–100° C. in the presence of N$_2$.

* * * * *